United States Patent [19]

Cascini

[11] 4,358,753

[45] Nov. 9, 1982

[54] HIGH RESOLUTION SHAFT POSITION ENCODER

[75] Inventor: Michael R. Cascini, Cedar Rapids, Iowa

[73] Assignee: Rockwell International Corporation, El Segundo, Calif.

[21] Appl. No.: 244,428

[22] Filed: Mar. 16, 1981

[51] Int. Cl.³ .............................................. G08C 9/00
[52] U.S. Cl. ........................... 340/347 P; 250/231 SE; 340/870.29
[58] Field of Search ................. 340/347 P, 870.29; 250/231 SE

[56] References Cited

U.S. PATENT DOCUMENTS

| | | | |
|---|---|---|---|
| 2,961,647 | 11/1960 | Dzaack | 340/347 P |
| 3,024,986 | 3/1962 | Strianese | 340/347 P |
| 3,122,735 | 2/1964 | Townsend | 340/347 P |
| 3,188,626 | 6/1965 | Palmer | 340/347 P |
| 3,242,478 | 3/1966 | Kaestmer | 340/347 P |
| 3,323,120 | 5/1967 | Uehlin | 340/347 P |
| 3,419,727 | 12/1968 | Pabst | 340/347 P |
| 3,525,094 | 8/1970 | Leonard | 250/231 SE |
| 3,581,306 | 5/1961 | Johnson | 340/347 P |
| 3,612,393 | 10/1971 | Jones | 340/347 P |
| 4,041,483 | 8/1977 | Groff | 340/347 P |

OTHER PUBLICATIONS

Knox, "IBM Technical Disclosure Bulletin", vol. 2, No. 3, Oct. 1959, pp. 18-19.

Primary Examiner—C. D. Miller
Attorney, Agent, or Firm—Terry M. Blackwood; H. Frederick Hamann

[57] ABSTRACT

An absolute-incremental hybrid shaft position encoder providing compacted high resolution. In the preferred embodiment an encoder track is superimposed by a shutter so as to make multiple track revolutions appear electrically as a single revolution.

15 Claims, 4 Drawing Figures

HIGH RESOLUTION SHAFT POSITION ENCODER

This invention relates to shaft position encoding.

U.S. Pat. No. 4,041,483, assigned to the Assignee of the present invention, shows a hybrid encoder which enjoys many of the advantages, while avoiding many of the disadvantages, of both absolute and incremental encoders.

The present invention permits an improvement over the hybrid encoders shown in the identified patent such that the improved hybrid encoders are capable of greater resolution per space required for the encoder. This and other advantages, objects, and features of the invention will become more apparent upon reference to the following specification and appended drawings in which.

Figure 1:
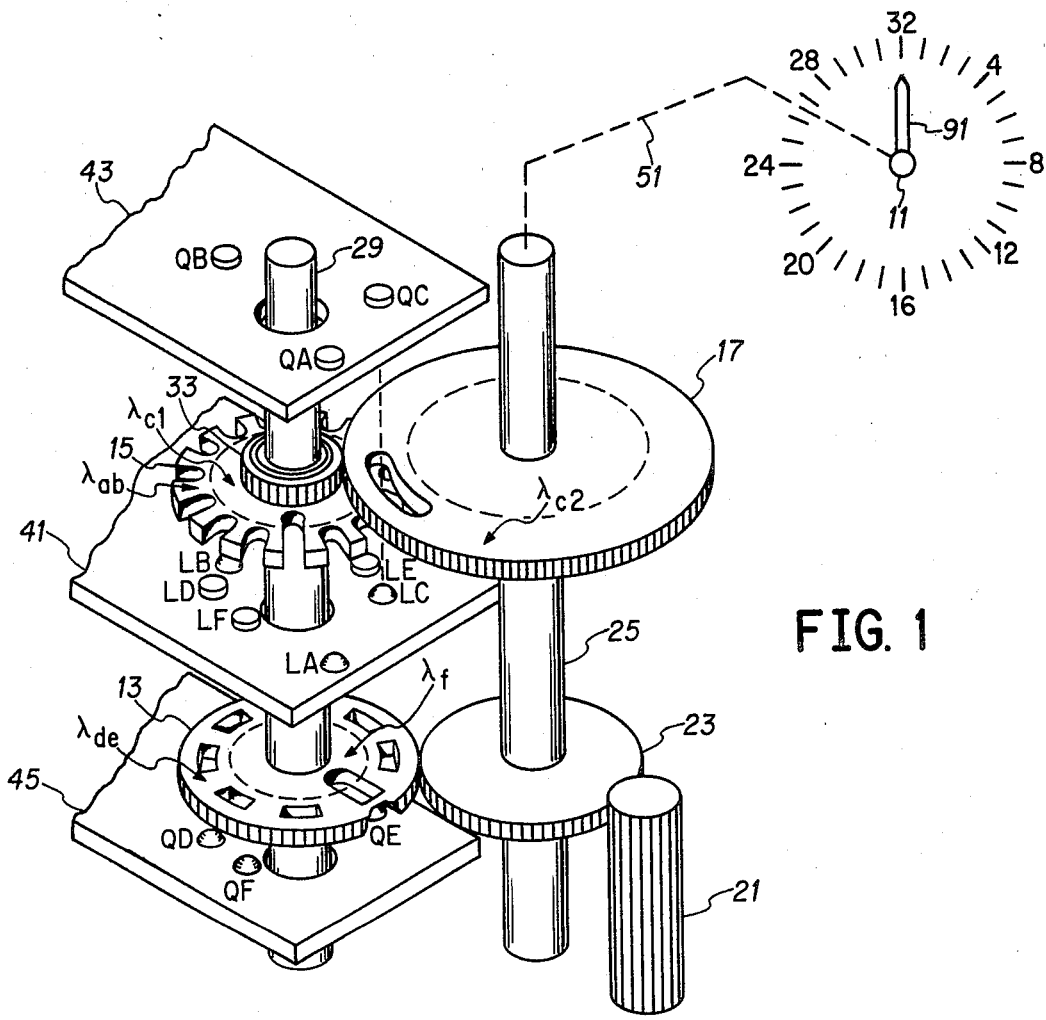
FIG. 1 is a perspective view representing the presently preferred inventive embodiment.

As shown in FIG. 1, the presently preferred embodiment utilizes optical transmissivity as the encoding medium and comprises six phototransistors and five circular encoded tracks which revolve as shaft 11, whose position is encoded, rotates. Each of the five tracks is implemented with one or more light transmissive sections and a like number of non-transmissive or opaque sections, and each phototransistor is associated with a particular track or tracks.

Two of the five tracks, namely $\lambda_{de}$ and $\lambda_f$, are concentrically located on element 13, the outer track $\lambda_{de}$ having eight transmissive sections and the inner track $\lambda_f$ having only one transmissive section. Two more of the five tracks, namely $\lambda_{ab}$ and $\lambda_{c1}$ are concentrically located on element 15, the outer track $\lambda_{ab}$ having sixteen transmissive sections and the inner track $\lambda_{c1}$ having only one transmissive section. The last of the five tracks namely, $\lambda_{c2}$, is located on element 17 and has only one transmissive section. The orbits of tracks $\lambda_{c1}$ and $\lambda_{c2}$ partially overlap so that the $\lambda_{c1}$ and $\lambda_{c2}$ combination is transmissive at the overlap only when both are simultaneously transmissive.

Phototransistors QA and QB are positioned axially above track $\lambda_{ab}$ so as to receive light, as permitted by track $\lambda_{ab}$, from LEDs LA and LB. Phototransistor QC is positioned axially above the overlap of $\lambda_{c1}$ and $\lambda_{c2}$ so as to receive light as permitted by tracks $\lambda_{c1}$ and $\lambda_{c2}$, from LED LC. Phototransistors QD and QE are positioned axially below track $\lambda_{de}$ so as to receive light, as permitted by track $\lambda_{de}$, from LEDs LD and LE. Phototransistor QF is positioned axially below $\lambda_f$ so as to receive light, as permitted by track $\lambda_f$ from LED LF.

As encoded shaft 11 rotates through (360°/32), track $\lambda_{c2}$ revolves through one 360° revolution, tracks $\lambda_{ab}$ and $\lambda_{c1}$ revolve through four 360° revolutions, and tracks $\lambda_{de}$ and $\lambda_f$ revolve through (33/32) 360° revolutions. Since each phototransistor changes between "on" and "off" states as the associated track or tracks permit or inhibit light to impinge thereon, the result is that there are, per 360° rotation of encoded shaft 11, (i) 32 "on" signals from QC, (ii) 33 "on" signals from QF (iii) $8192 = 2^{13}$ state transition signals from the (QA, QB) pair, and (iv) 1056 state transition signals from the (QD, QE) pair.

The FIG. 1 device is thus a high resolution device capable of resolving 8192 positions of shaft 11. The shutter effect accomplished between $\lambda_{c1}$ and $\lambda_{c2}$ allows a small diameter coded track such as $\lambda_{c1}$ to generate the same electrical waveforms as would generally be generated by a coded track of much larger diameter, the larger diameter being the conventional way to accommodate more transmissive sections of appropriate size, and more transmissive sections being the conventional way to provide greater resolution.

Moreover, each of 32 QC "on" signals (and thus each of 32 positions of shaft 11) is absolutely identifiable with proper use of QD, QE, and QF. For example, by establishing coincidence of QC and QF "on" signals and calling these the zeroth QC "on" signal and the zeroth QF "on" signal, there will be one state transition signal from the (QD, QE) pair between the first QF "on" signal and the first QC "on" signal. Further, there will be two state transition signals from the (QD, QE) pair between the second QF "on" signal and the second QC "on" signal. And so on, such that there will be 32 state transition signals from the (QD, QE) pair between the 32nd QF "on" signal and the 32nd QC "on" signal.

Still referring to FIG. 1, but now for a more complete and detailed description, an input gear 21 meshes with encoder gear 23 which is mounted on encoder gear shaft 25. Also mounted on shaft 25 is an encoder gear 17 which includes a single arcuate aperture which lies on a circumference concentric with shaft 25. The balance of this circumference is opaque or non-transmissive to light. Thus, gear 17, at this circumference, has one light transmissive section (i.e., the aperture) and one non-transmissive section, the two sections together constituting what is referred to herein as coded track $\lambda_{c2}$.

Gear 23 meshes with encoder gear 13 which is mounted on encoder gear shaft 29. Also carried by shaft 29 is an encoder gear 33 which is mounted on bearings so that gear 33 can move freely about shaft 29. Gear 33 meshes with gear 17 and furthermore, is attached to a circular disc 15 of apertured opaque material which includes two more circular coded tracks, namely, $\lambda_{ab}$ and $\lambda_{c1}$. More specifically, track $\lambda_{ab}$ lies along an outer circumference on disc 15 and comprises 16 regularly spaced apertures or light transmissive sections alternating with 16 opaque sections. Each light transmissive section in $\lambda_{ab}$ comprises a notch, or cutout. Track $\lambda_{c1}$ lies along an inner circumference on disc 15 and comprises a single light transmissive section and a single non-transmissive section, the light transmissive section being a small through-hole and the non-transmissive section being the balance of this inner circumference on disc 15. In the illustrated embodiment, the aperture for track $\lambda_{c1}$ is actually joined with one of the apertures for track $\lambda_{ab}$, the result being alternatively describable as a single, radially elongated aperture intersecting both the inner and outer circumferences on disc 15.

Gear 13 is appropriately apertured so as to include two more coded circular tracks, namely, $\lambda_{de}$ and $\lambda_f$. More specifically, track $\lambda_{de}$ lies along an outer circumference on gear 13 and comprises eight regularly spaced apertures or light transmissive sections alternating with eight opaque sections. Each light transmissive section in $\lambda_{de}$ comprises an arcuate slot or through-hole. Track $\lambda_f$ lies along an inner circumference on gear 13 and comprises a single light transmissive section and a single non-transmissive section, the light transmissive section being a small through-hole and the non-transmissive section being the balance of this inner circumference on gear 13. In the illustrated embodiment, the aperture for track $\lambda_f$ is actually joined with one of the apertures for track $\lambda_{de}$, the result being alternatively describable as a single, radially elongated aperture intersecting both the inner and outer circumferences on gear 13.

Mounted on board 41, between disc 15 and gear 13, are three upwardly radiating LEDs, namely, LA, LB, and LC. Also mounted on board 41 are three downwardly radiating LEDs, namely LD, LE, and LF. Above disc 15, on board 43, there are mounted three downwardly looking phototransistors, namely, QA, QB, and QC. Below gear 13, on board 45, there are mounted three upwardly looking phototransistors, namely QD, QE, and QF.

LEDs LD and LE are positioned such that their emitted light is received by QD and QE respectively, subject to such light being passed or blocked by track $\lambda_{de}$. Usually, LD and LE lie on a circle (i) whose radius is the same as track $\lambda_{de}$ and (ii) which is coaxial with track $\lambda_{de}$. Also, QD and QE usually lie on a circle (i) whose radius is the same as track $\lambda_{de}$ and (ii) which is coaxial with track $\lambda_{de}$.

In like manner, LED LF is positioned such that its emitted light is received by QF subject to such light being passed or blocked by track $\lambda_f$. Also in like manner, LEDs LA and LB are positioned such that their emitted light is received by QA and QB respectively, subject to such light being passed or blocked by track $\lambda_{ab}$. In further like manner, LED LC is positioned such that its emitted light is received by QC subject to such light being passed or blocked by one or both of tracks $\lambda_{c1}$ and $\lambda_{c2}$.

Gear 23 comprises a 66 tooth, 96 pitch gear. Gear 17 comprises a 132 tooth, 120 pitch gear. Gear 33 comprises a 33 tooth, 120 pitch gear. Gear 13 comprises a 64 tooth, 96 pitch gear. Encoded shaft 11 may be coupled via appropriate gears to either of the encoder device gear shafts 25 or 29, or may be coupled via appropriate gears to input gear 21. In the preferred embodiment, shaft 11 is coupled with shaft 25 through gears represented in FIG. 1 by dashed line 51. The gear ratio of 51 is chosen such that for one 360° rotation of shaft 11, shaft 25 rotates 32×360°. Alternatively stated, for a rotation of shaft 11 of (360°/32), shaft 25, and thus track $\lambda_{c2}$, move through exactly one 360° revolution.

To summarize, the gear ratios of the preferred embodiment establish the following relationships, namely: as track $\lambda_{c2}$ revolves through one 360° revolution, (i) tracks $\lambda_{c1}$ and $\lambda_{ab}$ revolve through four 360° revolutions, (ii) tracks $\lambda_{de}$ and $\lambda_f$ revolve through (33/32) 360° revolutions, and (iii) shaft 11 rotates 1/32 of 360°.

Disc 15 is about 0.687 inches in diameter and the width of each of the sixteen $\lambda_{ab}$ notches therein is about 0.056 inches. The diameter of the through-hole on the $\lambda_{c1}$ track is about 0.060 inches. Gear 13 is about 0.6667 inches in diameter and each of the arcuate through-holes therein is about 0.100 inches by 0.045 inches. The elongated hole in gear 13 has an opening of about 0.100 inches on the $\lambda_{de}$ track and a diameter of about 0.109 inches on the $\lambda_f$ track. Gear 17 has a diameter of about 1.1000 inches and the arcuate slit therein has an arcuate length of about 0.249 inches and a width of about 0.062 inches. Presently employed for each of the phototransistors is a phototransistor type No. SRD-604 available from Motorola. Presently employed for each of the LEDs is an LED type No. SL1312-2 available from Texas Instruments.

Figure 2:
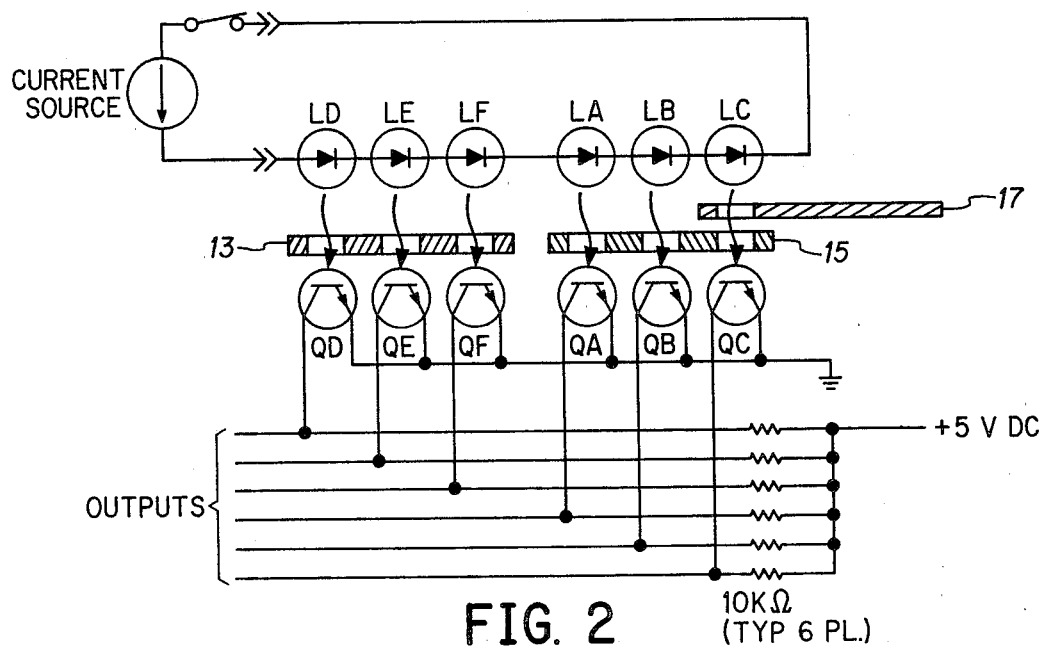
FIGS. 2 and 3 are schematics representing apparatus for processing and/or using the signals available from the FIG. 1 apparatus.

Turning now to FIG. 2, therein is functionally represented a preferred mode of LED excitation and a preferred way of interfacing the phototransistor sensors with logic and/or computer circuitry. More specifically, the six LEDs are connected in series and this series connection is excited by a dc current source to ensure a balanced, consistent light output from all six LEDs. Each phototransistor collector output is tied through a 10 kilohm pullup resistance to +5 volts dc and is presented as an encoder sensor output. The emitters of the phototransistors are connected to ground. The encoder outputs are electrically compatible with the input ports of the 8048 family of microcomputers. It should further be noted that an "on" state, or logic one level output, of a phototransistor (i.e., the output corresponding in the preferred embodiment to an optically transmissive encoder region) is represented, when employing the FIG. 2 apparatus, as a low voltage current sink state on an encoder output line. Furthermore, an "off" state, or logic 0 level output, of a phototransistor (i.e., the output corresponding in the preferred embodiment to an optically opaque encoder region) is represented, when employing the FIG. 2 apparatus, by a 10 kilohm impedance to +5 volts dc.

Figure 3:
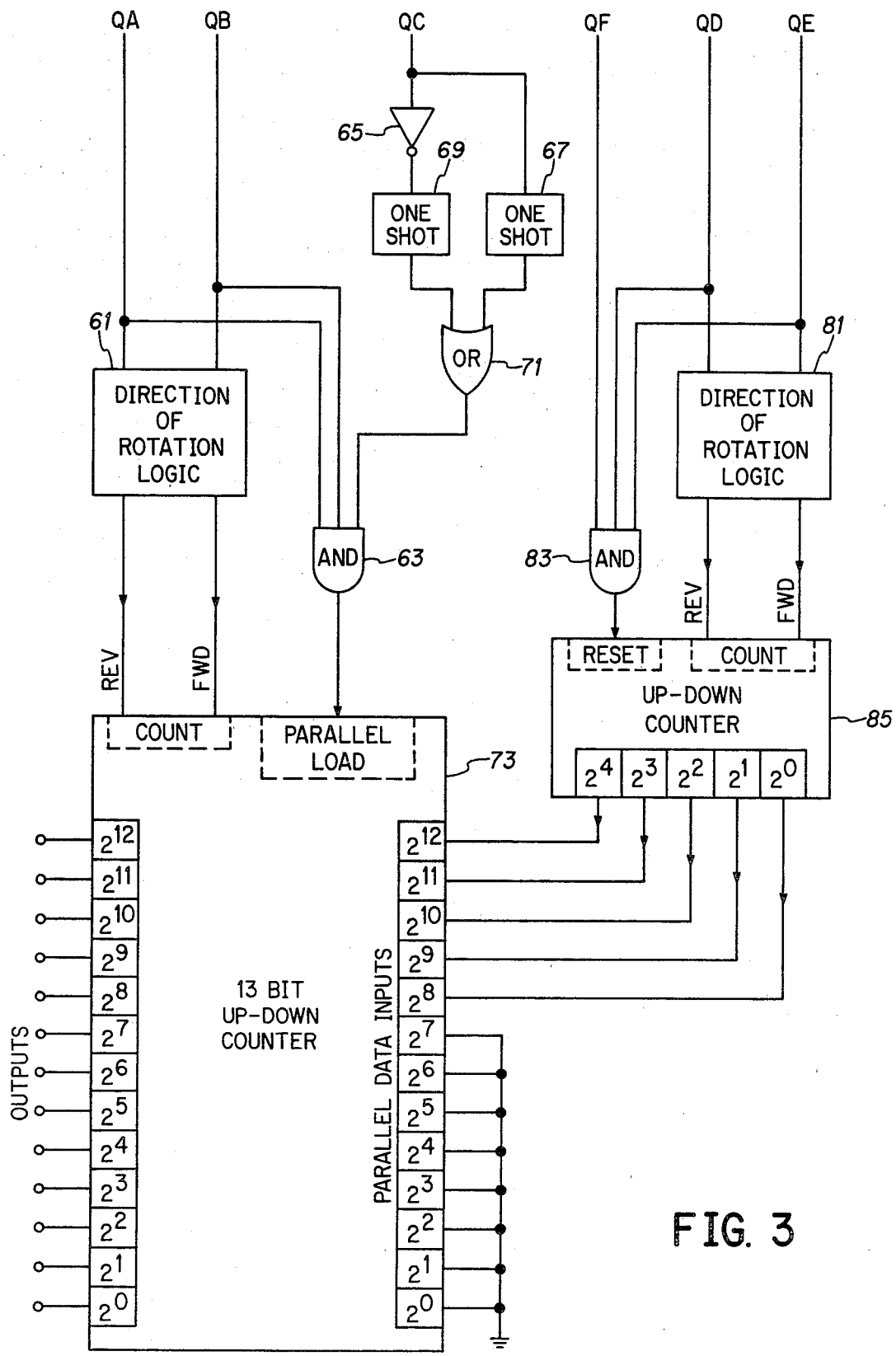

FIG. 3 shows apparatus for further using or processing the sensor signals. More particularly, the outputs of QA and QB are fed to a direction of rotation logic circuit 61 and also to an AND gate 63. Circuit 61 senses the relative phase between the QA and QB outputs (which changes with rotation direction change of $\lambda_{ab}$) and outputs pulses on the proper one of lines REV or FWD, each pulse representing a state transition signal (i.e., a change between on and off states) from either QA or QB. The QC output is fed to NOT circuit 65 and to one-shot 67, the NOT circuit output going to a second one-shot 69. The two one-shot outputs are fed to OR gate 71 whose output is then fed to AND gate 63 to be ANDED with QA and QB.

The lines REV and FWD from 61 are fed to an appropriate input of 13 bit up/down counter 73 which counts each pulse on these lines and counts up or down depending on which input line the input pulse appears. The output of AND gate 63 is fed to a parallel load input of the 13 bit counter 73. A pulse at this input casues the count at the parallel data inputs to be transferred to the output lines, regardless of the count which existed on the output lines.

The QD and QE outputs are fed to a direction of rotation logic circuit 81 and also to AND gate 83. Circuit 81 serves the same purpose for the QD and QE outputs as circuit 61 serves for the QA and QB outputs. The OF output is fed to AND gate 83 for being ANDED with QD and QE. The lines REV and FWD from 81 are fed to an appropriate input of a five-bit up/down counter 85 which counts each pulse and counts up or down depending on which input line the input pulse appears. The output of AND gate 83 is fed to a reset input of the five-bit counter 85. A pulse at this input causes the count at the output to be reset to zero.

At the counter 73 parallel data inputs, bits zero through seven are connected to ground and are thus always at a logic zero. At the counter 73 parallel data inputs, bits eight through twelve are connected respectively to counter 85 output bits zero through four.

Figure 4:
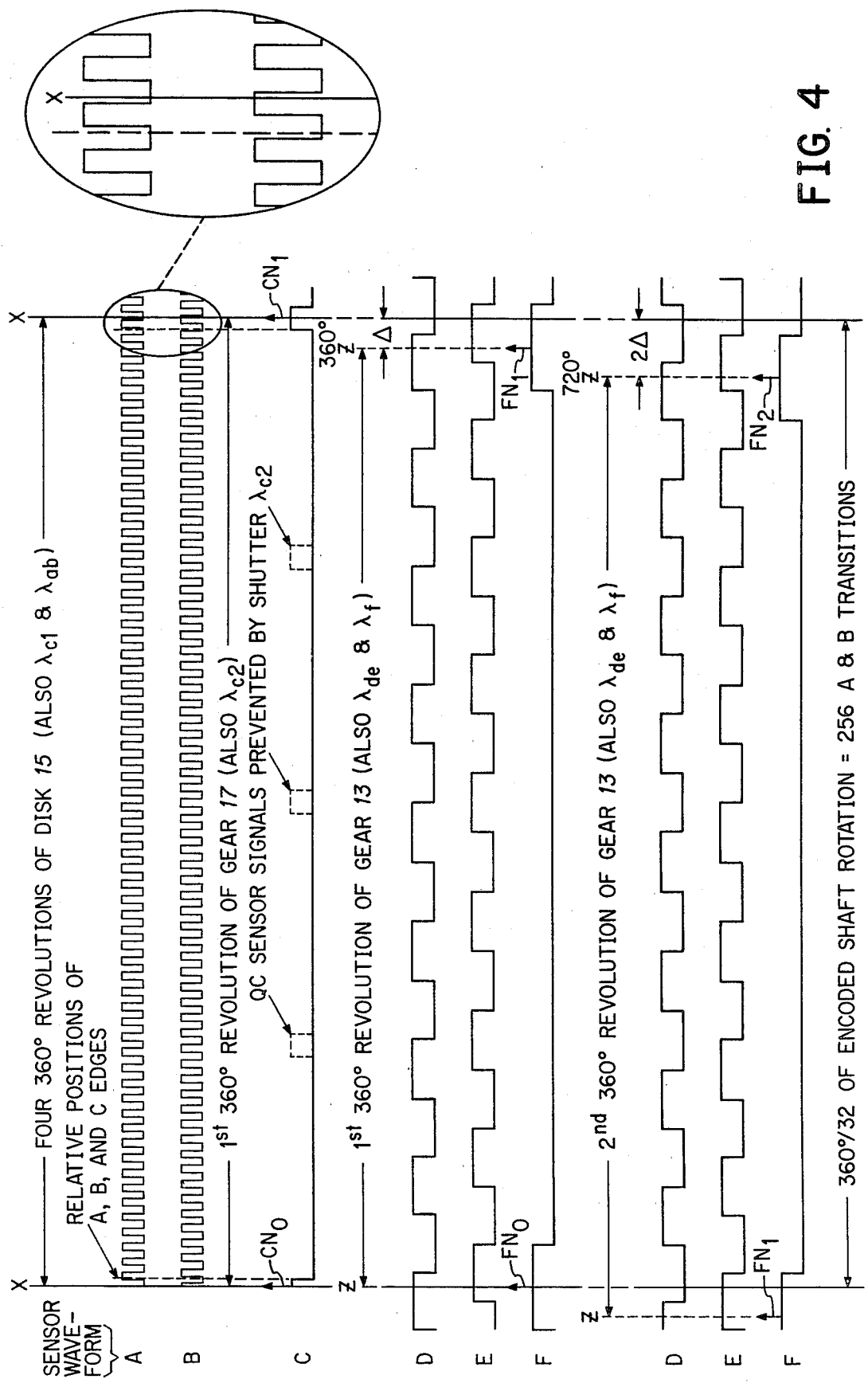
FIG. 4 shows waveforms useful in explaining the operation of the FIG. 1 apparatus.

Turning now to FIG. 4, the therein illustrated waveforms A, B, C, D, E, and F represent outputs from, respectively, sensors QA, QB, QC, QD, QE, and QF. The illustrated interval X—X represents one 360° revolution of $\lambda_{c2}$ and thus also represents four 360° revolutions of $\lambda_{ab}$ and $\lambda c1$. The illustrated interval Z—Z represents one 360° revolution of $\lambda_{de}$ and $\lambda_f$. Thus the interval X—X is equal to 33/32 times the interval Z—Z.

For one interval X—X, waveform A comprises 64 logic one or "on" states alternating with 64 logic zero or "off" states. Also for the X—X interval, waveform B comprises 64 logic one or "on" states alternating with 64 logic zero or "off" states. Also for the X—X interval, waveform C comprises one relatively short pulse (i.e., a logic one or "on" state) and one relatively long logic zero or "off" state. Sensors QA, QB, and QC are appropriately positioned such that waveforms A and B are phase separated by approximately 90°. The relative phase of A, B, and C are further pictorially defined in FIG. 4.

It should be noted that the $\lambda_{c1}$ aperture is positioned between LC and QC four times per X—X intervals. However, only once per X—X interval does the $\lambda_{c2}$ aperture align with the $\lambda_{c1}$ aperture and permit QC to receive light from LC. Thus, the shutter effect of $\lambda_{c2}$ prevents several C pulses from being generated.

It should further be noted that per X—X interval, waveform A has 128 transitions between states and waveform B also has 128 transitions between states. There are thus 256 A and B transitions per X—X interval and since A and B are in phase quadrature, the 256 transitions are substantially regularly spaced. Thus, per (360°/32) rotation of encoded shaft 11, 256 smaller angles are indicated and resolved, each of the 256 smaller angles being substantially equal to (360°/32/(256).

Waveforms A, B, and C repeat as shown for each X—X interval and thus A, B, and C are illustrated only for the first X—X interval. Waveforms D, E, and F repeat on a shorter interval Z—Z, and thus D, E, and F are shown for two selected X—X intervals, namely, the first and second X—X intervals. Although the "folding under" illustrational technique used in FIG. 4 is likely already appreciated by the reader, it should be expressed that the FIG. 4 illustration shows the D, E, and F during the second X—X interval below the first X—X interval. One might normally prefer to see the second interval to the right of and as a continuation of the first interval, but the illustrational technique was used in FIG. 4 to permit greater resolution in the drawing.

Still referring to FIG. 4, for each Z—Z interval, waveform D comprises eight "on" states alternating with eight "off" states, waveform E comprises eight "on" states alternating with eight "off" states, and waveform F comprises one relatively short pulse or "on" state and one relatively long "off" state. Sensors QD, QE, and QF are appropriately positioned such that waveforms D and E are phase separated by approximately 90°. The relative phase of D, E, and F are further pictorially defined in FIG. 4.

Since waveforms D and E are substantially in phase quadrature, there are, per Z—Z interval, 32 substantially evenly spaced state transitions from the (D, E) pair, 16 transitions being from D and an interleaved 16 transitions being from E.

For more precise determination of pulse location, the "on" states, or pulses, of waveforms C and F are processed to produce narrower pulses and for illustrational conciseness in FIG. 4 these narrower C and F pulses are shown as arrows labeled CN and FN respectively.

The tracks and sensors are appropriately arranged such that at some reference position, a CN pulse, namely $CN_0$, is coincident with an FN pulse, namely $FN_0$. There are no D or E transitions between $CN_0$ and $FN_0$. At the occurrence of the next CN pulse, namely $CN_1$, the FN pulse next following $FN_0$, namely $FN_1$ has occurred earlier by an amount $\Delta$. Between $FN_1$ and $CN_1$ there is one transition from the D, E pair. At the occurrence of the next CN pulse, namely $CN_2$, the FN pulse next following $FN_1$, namely $FN_2$, has occurred earlier by an amount $2\Delta$. Between $FN_2$ and $CN_2$ there are two transitions from the D, E pair. (It should be apparent that if C were illustrated for the second X—X interval using the above-mentioned "folding under" illustrational approach, $CN_2$ would fall directly under $CN_1$ in FIG. 4.)

This trend continues such that for example, between $FN_{17}$ and $CN_{17}$, there are 17 transitions of the D, E pair. For further example, between $FN_{31}$ and $CN_{31}$, there are 31 transitions of the D, E, pair. In the preferred embodiment which uses the 33:32 ratio, the CN pulse following $CN_{31}$ is $CN_0$, and the FN pulse following $FN_{32}$ is $FN_0$.

Thus each one of 32 different CN pulses is absolutely identifiable from all the other CN pulses because between each CN pulse and a nearby FN pulse there occurs a number of D, E transitions which permits identification of the particular CN pulse. In variations on the preferred arrangement, the number of D, E transitions need not be exactly equal to the number of a particular CN pulse. An identifying number of D, E transitions is of course sufficient.

Returning briefly to FIG. 1, each different one of the 32 encoded shaft positions (as represented via the pointer 91 and the dial face) corresponds to a particular and different one of the 32 CN pulses. Thus, each one of the 32 positions of shaft 11 is absolutely identifiable due to an identifying number of serial counts or transitions occurring adjacent the particular position. Additionally, since each of the $32=2^5$ sectors are further resolved into $256=2^8$ increments, the total number of encoded positions of shaft 11 is $2^{13}$. Returning briefly to FIG. 3, counter 85 counts the D and E transitions and is reset to zero by the FN pulses. Counter 73 counts the A and B transitions and is caused to load the parallel inputs by the CN pulses.

For purposes of further expansion, explanation, and presentation, the disclosure and teachings of U.S. Pat. No. 4,041,483 are hereby incorporated by reference into the present disclosure.

To highlight the above discussion, it is again pointed out that the shutter action of $\lambda_{c2}$ enables physical compaction of high resolution; i.e., permits greater resolution per space required. In essence, and in terms of electrical performance, track $\lambda_{ab}$ appears to comprise 64 apertures alternating with 64 opaque sections. Yet track $\lambda_{ab}$ actually comprises only 16 aperatures and 16 opaque sections. Thus, the diameter of disc 15 is only as large as that which is sufficient to accommodate 16 aperature and 16 opaque sections. Disc 15 need not be physically large enough to accommodate 64 aperature and 64 opaque sections. The improved hybrid encoder accordingly is capable of identifying absolute shaft position and, simultaneously, of compacted high resolution.

It is important to note that the inventive principles hereinabove set forth encompass many variations of the preferred embodiment. For example, it is presently contemplated as desirable for some applications to change the $256=2^8$ transitions per (360°/32) of shaft 11 rotation to $2^7$, $2^9$ or $2^{10}$ transitions per $(360°/32)$ of shaft 11 rotation. This could easily be accomplished by changing the present turns ration of 4:1 between gear 33 and gear 17 to 2:1, 8:1, or 16:1. These numbers are considered advantageous because of their high resolution compacting effect and because of their compatibility with electronic counters.

As a further example of possible variations, LC and QC could be relocated outside the shadow of disc 15 so that the light received by QC would only be controlled by $\lambda_{c2}$. In such a case, the QC received light would not pass through the $\lambda_{c1}$ aperture and $\lambda_{c1}$ could be discarded or ignored. However, for this variation, the aperture of $\lambda_{c2}$ should be smaller and/or more precisely positioned than the arcuate slit of FIG. 1. Thus, for ease of assembly and construction, the FIG. 1 five-track apparatus is presently contemplated as preferable to this variation.

Another possible variation, either separately or cumulatively, would be to discard or ignore track $\lambda_{de}$ and the associated LEDs LD and LE and the associated sensors QD and QE. The identifiability of the 32 different positions of shaft 11 could be retained because there are also an identifying number of A and B transitions between a particular CN pulse and the nearby FN pulse. As a further possible variation, the shutter effect of $\lambda_{c2}$ may be accomplished with altogether electronic circuitry, especially if such circuitry is non-volatile. More particularly, $\lambda_{c2}$ in a sense provides division by four and similar division is commonly accomplished by electronic counters or the like. A non-volatile counter would retain its accumulated count even during power outage. However, to prevent not detecting an alignment between QC and the $\lambda_{c1}$ hole during outages, a non-volatile sensor and source should be employed. This electronic division is not presently contemplated as a preferred alternative but is nevertheless an alternative permitting discarding or ignoring track $\lambda_{c2}$.

Another possible variation to accomplish the effect of the shutter but without $\lambda_{c2}$, would be to have a cam on shaft 25 which controlled a switch permitting QC output pulses only every fourth occurrence of QC alignment with the $\lambda_{c1}$ aperature.

Another variation which may be particularly desirable in some applications is the use of magnetic sensors instead of phototransistor sensors. Such a variation could employ permanently magnetized and encoded tracks and of course would not use either LEDs or phototransistors.

It is again pointed out that the above are merely examples of, and not comprehensive of, several possible variations using the principles of the present invention.

Thus, while particular embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:

1. Shaft position encoder means comprising:
   first means for generating a signal $\sigma_1$ as said shaft rotates an angle $\alpha_1$, said first means including a coded track $CDT_1$ and an associated sensor means $SEN_1$ between which relative movement is caused as said shaft rotates, said first means requiring, as a condition for generating a signal $\sigma_1$, an appropriate alignment between the sensor means $SEN_1$ and a predetermined part of said track $CDT_1$, said first means further including controlling means, responsive to rotation of said shaft, for allowing one or more predetermined occurrences of said alignment, but less than all occurrences of said alignment, to result in the generation of a signal $\sigma_1$,
   second means for generating a signal $\sigma_2$ as said shaft rotates an angle $\alpha_2$, where $\alpha_2 \neq \alpha_1$, said second means including a coded track $CDT_2$ and an associated sensor means $SEN_2$ between which relative movement is caused as said shaft rotates, and
   third means for generating a signal $\sigma_3$ as said shaft rotates an angle $\alpha_3$, said third means including a coded track $CDT_3$ and an associated sensor means $SEN_3$ between which relative movement is caused as said shaft rotates,
   each of sensor means $SEN_1$, $SEN_2$, and $SEN_3$, (a) being sensitive to the associated one of the three numerically subscripted tracks $CDT_1$, $CDT_2$, and $CDT_3$ and (b) being insensitive to the other two of the three numerically subscripted tracks,
   $\alpha_3$ being related to $\alpha_1$ and $\alpha_2$ so that (i) between the Uth occurrence of signal $\sigma_1$ and a nearby occurrence of signal $\sigma_2$ there occurs a number V of signals $\sigma_3$, the number V permitting identification of the number U, and (ii) between the Wth occurrence of signal $\sigma_1$ and a nearby occurrence of signal $\sigma_2$ there occurs a number Y of signals $\sigma_3$, the number Y permitting identification of the number W, W being $\neq U$ and Y being $\neq V$, whereby, each one of a plurality of signals $\sigma_1$ is absolutely identifiable and distinguishable from all the other ones of said plurality of signals $\sigma_1$ because between each signal $\sigma_1$, of said plurality, and a nearby signal $\sigma_2$ there occurs a different number of signals $\sigma_3$ which thereby permits identification of the particular signal $\sigma_1$.

2. Encoder means as defined in claim 1 wherein said first means comprises a further coded track $CDT_c$, moving as said shaft rotates, for controlling which of said alignments results in a signal $\sigma_1$ being generated.

3. Encoder means as defined in claim 1 or 2 wherein said sensor means $SEN_3$ comprises a pair of sensors for generating a pair of waveforms as relative movement takes place between $SEN_3$ and $CDT_3$, each waveform having one or more high states and one or more low states.

4. Encoder means as defined in claim 3 wherein each signal $\sigma_3$ comprises a transition between states.

5. Encoder means as defined in claim 4 wherein said waveforms are not in phase with one another.

6. Encoder means as defined in claim 5 wherein each sensor means comprises photoelectric means.

7. Encoder means as defined in claim 5 wherein each sensor means comprises photoelectric means and each track exhibits at least two different values of light transmissivity.

8. Encoder means as defined in claim 1 or 2 wherein $\alpha_1$, $\alpha_2$, and $\alpha_3$ are substantially equal to, respectively, $(360°/32)$, $(360°/33)$, and $(360°/33)/(32)$.

9. Encoder means as defined in claim 1 or 2 wherein $\alpha_1$, $\alpha_2$, and $\alpha_3$ are substantially equal to, respectively, $(360°/N_1)$, $(360°/N_2)$, and $(360°/N_2)/(N_3)$, where $N_1$, $N_2$, and $N_3$ are predetermined non-zero integers.

10. Encoder means as defined in claim 9 wherein $N_1 = 2^P$ where P is a predetermined non-zero integer.

11. Encoder apparatus as defined in claim 10 wherein $N_3 = 2^R$ where R is a predetermined non-zero integer.

12. Encoder apparatus as defined in claim 11 wherein $P=R$.

13. Encoder means as defined in claim 12 wherein the difference between $N_1$ and $N_2$ is equal to 1.

14. Encoder means as defined in claim 13 wherein said sensor means $SEN_3$ comprises a pair of sensors for generating a pair of waveforms as relative movement takes place between $SEN_3$ and $CDT_3$, each waveform having one or more high states and one or more low states, and said waveforms not being in phase with one another.

15. Encoder means as defined in claim 9 and further comprising fourth means for generating a signal $\sigma_4$ as said shaft rotates an angle $\alpha_4$, said fourth means including a coded track $CDT_4$ and an associated sensor means $SEN_4$ between which relative movement is caused as said shaft rotates, $\alpha_4$ being related to $\alpha_1$ such that per each signal $\sigma_1$ there occurs a plurality of signals $\sigma_4$, said plurality of signals $\sigma_4$ being equal to $2^L$ where L is a predetermined one of the integers 7, 8, 9, or 10.

* * * * *